United States Patent [19]

Kobayashi

[11] 4,044,855

[45] Aug. 30, 1977

[54] LOUDSPEAKER DEVICE

[75] Inventor: Fumio Kobayashi, Hino, Japan

[73] Assignee: Sansui Electric Co., Inc., Tokyo, Japan

[21] Appl. No.: 627,335

[22] Filed: Oct. 30, 1975

[30] Foreign Application Priority Data

Nov. 1, 1974 Japan ................................ 49-126290

[51] Int. Cl.$^2$ ................................................ H05K 5/00

[52] U.S. Cl. ...................................................... 181/151

[58] Field of Search .......... 181/DIG. 1, 146, 148–156, 181/199; 179/1 E

[56] References Cited

U.S. PATENT DOCUMENTS

| | | | |
|---|---|---|---|
| 2,138,717 | 11/1938 | Volk | 181/151 |
| 2,775,309 | 12/1956 | Villchur | 181/151 X |
| 3,177,301 | 4/1965 | Hecht | 181/151 X |
| 3,720,285 | 3/1973 | Russell et al. | 181/151 |
| 3,835,256 | 9/1974 | Wieder | 181/154 |

*Primary Examiner*—Lawrence R. Franklin

[57] ABSTRACT

A loudspeaker device, wherein a speaker cabinet fitted with a speaker unit is filled with flexible gas-bearing material and fibrous cotton-like material. According to this invention, it is possible to increase the apparent inner volume of the cabinet, prevent the generation of a standing wave and reproduce sounds with a good quality.

11 Claims, 14 Drawing Figures

LOUDSPEAKER DEVICE

This invention relates to improvement on a loudspeaker device having a loudspeaker unit fitted to a loudspeaker cabinet.

With the prior art speaker device of the above-mentioned type, a closed speaker cabinet C (hereinafter referred to as a "cabinet") fitted with a speaker unit SP as illustrated in FIGS. 1A and 1B has its inner walls bonded with fibrous cotton-like material GW such as glass wool, rock wool or coarse felt, or is filled with a folded form of the cotton-like material so as to prevent the occurrence of a standing wave in the cabinet C or fully to suppress the vibration of the walls of the cabinet C, thereby preventing the generation of a resonance peak over a low frequency region and attaining a smooth decline of sound pressure over the low frequency region.

When the cabinet C is filled with, for example, glass wool, an inertial reactance and a considerable amount of resistance are applied on the backside of the speaker unit SP according to the mass and resistance of the filler material. Accordingly, sound vibrations in the cabinet C are appreciably absorbed by the aforesaid inertial reactance and resistance, resulting in the slow propagation of vibrations, and in consequence an increase in the apparent inner volume of the cabinet C. Moreover, the aforesaid inertial reactance decreases the rise of a low cutoff frequency and more reduces the inner volume of the cabinet C with respect to the same low cutoff frequency than would otherwise be attained. The above-mentioned cotton-like filler material GW, for example, glass wool is used to increase the apparent inner volume of the cabinet C by damping the vibrations of the backside of the speaker unit SP and prevent the occurrence of a standing wave from sound reflections in the cabinet C.

The cotton-like filler material GW such as glass wool, rock wool and coarse felt can indeed effectively damp the backside of the speaker unit SP, but can not be considered fully to prevent sound reflections in the cabinet C. Where a loudspeaker device is constructed, therefore, disagreement arises between the required amount of a filler material GW, for example, glass wool and the process of filling the cabinet C with the filler material GW to maximize the apparent inner volume of the cabinet C and the required amount of the filler material GW and the process of filling the cabinet C with the filler material GW to minimize sound reflections in the cabinet C. Moreover, as the cabinet C increases in size, the appearance of a standing wave caused by sound reflections in the cabinet C is shifted toward a low frequency region, presenting difficulties in suppressing the generation of the standing wave. Further, the foregoing description refers to the case where only the physical properties of the constituent members of a loudspeaker device were taken into account. Where, however, tone quality is considered, it is necessary to optimize the Q of the speaker unit SP which varies with the damping condition of the backside of the speaker unit SP. However, the required amount of the filler material GW, for example, glass wool to optimize the Q of the speaker unit does not coincide with that used to minimize sound reflections in the cabinet C.

Accordingly, it is the object of this invention to provide a loudspeaker device capable of sufficiently damping the backside of a speaker unit thereby increasing the apparent volume of a cabinet and fully preventing the generation of a standing wave caused by sound reflections in the cabinet and reproducing high quality sounds.

According to this invention there is provided a loudspeaker device having a speaker unit and a speaker cabinet fitted with the speaker unit, the speaker cabinet comprising at least one first inner region filled with a first filler material formed of a flexible, gas-bearing material and at least one second inner region disposed adjacent to said first inner region and filled with a second filler material made of fibrous cotton-like material.

This invention can be more fully understood from the following detailed description when taken in conjunction with the accompanying drawings, in which.

Figure 5A:
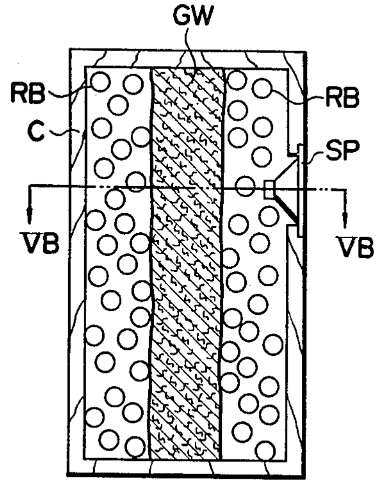
Figure 5B:
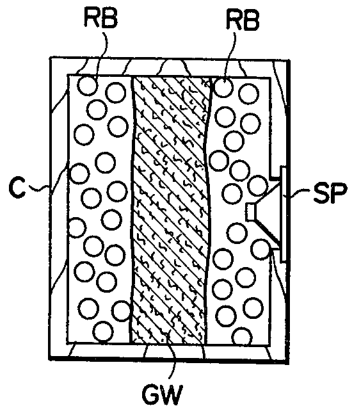
Figure 6A:
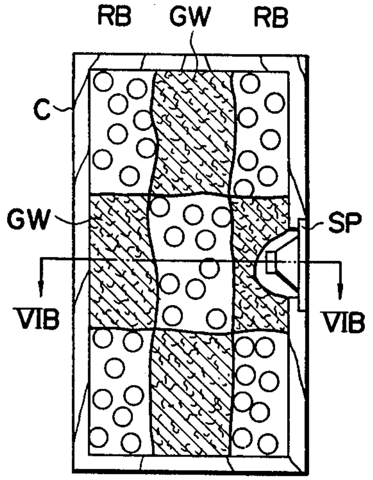
Figure 6B:
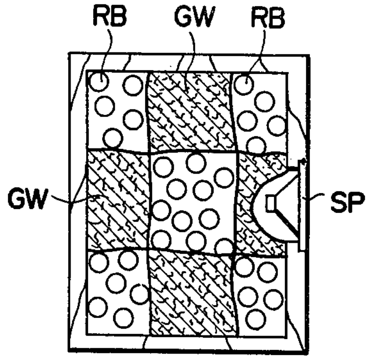
Figure 7A:
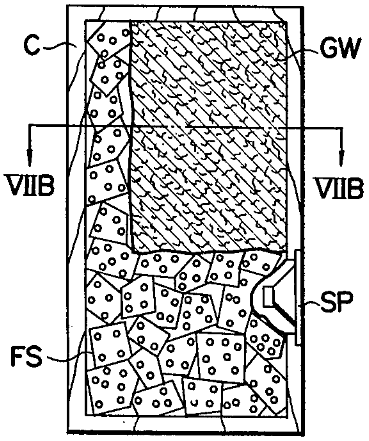
Figure 7B:
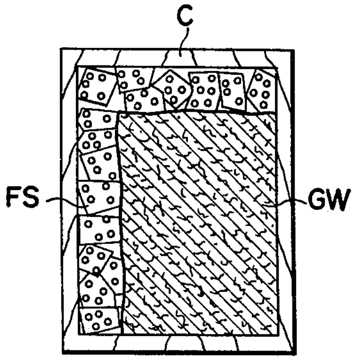

FIG. 5A presents the arrangement of a loudspeaker device according to still another embodiment of the invention;

FIG. 5B is a sectional view on line VB—VB of FIG. 5A;

FIG. 6A is a longitudinal sectional view showing the arrangement of a loudspeaker device according to a further embodiment of the invention;

FIG. 6B is a sectional view on line VIB—VIB of FIG. 6A;

FIG. 7A is a longitudinal sectional view showing the arrangement of a loudspeaker device according to a still further embodiment of the invention;

FIG. 7B is a sectional view on line VIIB—VIIB of FIG. 7A; and

Figure 8:
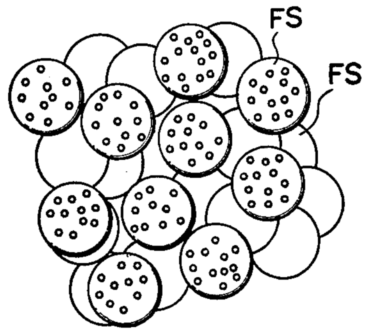
Figure 9:
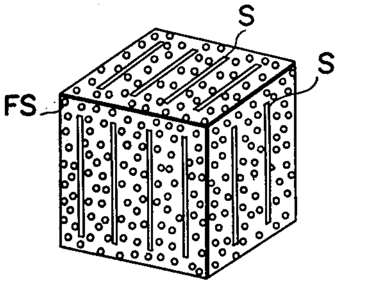
Figure 10:
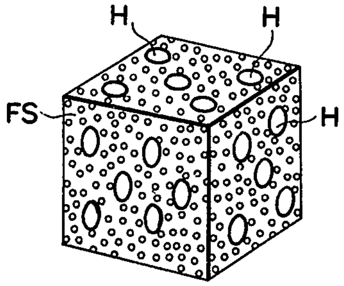

FIGS. 8 to 10 are perspective views of different forms of filler material used in the loudspeaker device of the invention.

Figure 2:
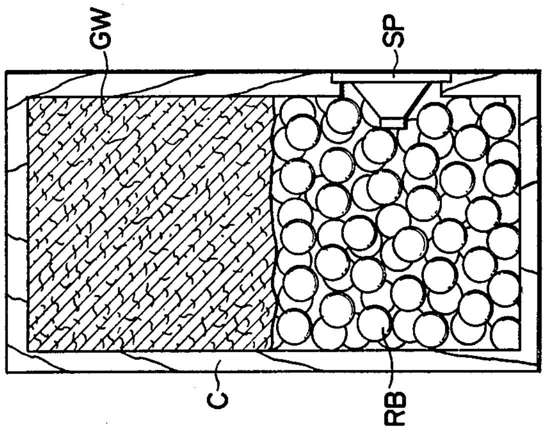
FIG. 2 is a longitudinal sectional view of a loudspeaker device according to an embodiment of the invention.

Referring to FIG. 2, a speaker unit SP is fitted to the lower part of a cabinet C. The upper inner half region of the cabinet C is filled with fibrous cotton-like filler material GW such as glass wool used in the prior art loudspeaker device in the laminated form, for example. The lower inner half region of the cabinet C behind the speaker unit SP is filled with a flexible, air or gas-bearing material RB consisting of, for example, a large number of rubber balls or soft tennis balls each of which has a different vibration-damping property from the aforesaid fibrous cotton-like filler material GW and displays an air load mass-adding action.

In the above-mentioned arrangement, it is assumed that the cotton-like material GW filled in the upper inner half region of the cabinet C applies inertial reactance and resistance to sound waves and the flexible gas-bearing material RB consisting of, for example, rubber balls RB and filled in the lower inner half region applies resistance and added compliance to sound waves. The rubber balls are considered to act as resistance to sound waves during their passage through the interstices between the balls, and apply an air load mass to sound waves, that is, act as added compliance. The above-mentioned construction enables the vibrations of the backside of the speaker unit SP to be fully suppressed by the added compliance, inertial reactance and two different forms of resistance derived from the cotton-like filler material GW such as glass wool filled in the upper inner half region of the cabinet C and another gas-bearing filler material RB formed of, for example, rubber balls and filled in the lower inner half region of the cabinet C. Moreover, the added compliance mainly provided by the rubber ball filler material RB effectively prevents sound reflections in the cabinet C even over a low frequency range. A combination of the above-mentioned two kinds of filler material cooperates in effectively damping the vibrations at the backside of the speaker unit SP to fully increase the apparent inner volume of the cabinet, effectively preventing the occurrence of a standing wave and providing high quality reproduced sounds.

Figure 1B:
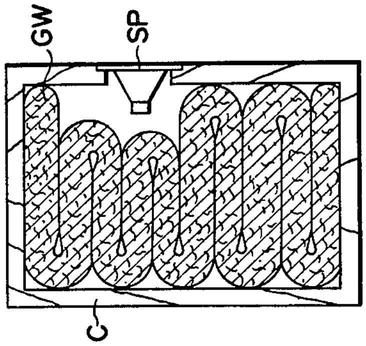
FIGS. 1A and 1B are longitudinal sectional views showing the different constructions of a prior art loudspeaker device.
Figure 1A:
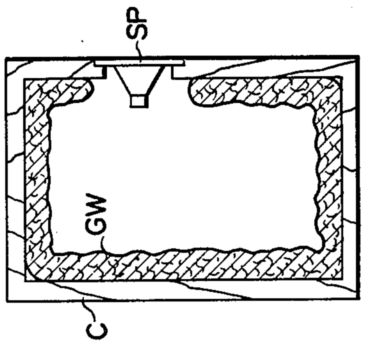
FIG. 1A PRIOR ART
Figure 3:
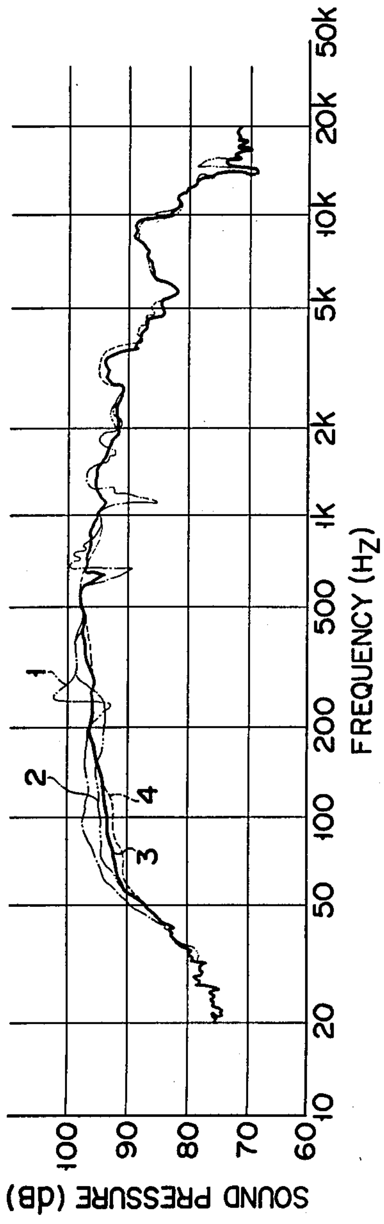
FIG. 3 is a curve diagram showing the sound pressure characteristics of a loudspeaker device when the speaker cabinet thereof is filled with various kinds of filler material.

A cabinet C having internal dimensions of 710 mm × 290 mm × 250 mm was experimentally fitted with a conical speaker unit SP 8 inches (about 200 mm) in diameter which had a low resonance frequency $f_0 \simeq 58$ Hz as measured in a separated state. The cabinet C was filled with different kinds and amounts of filler material. Measurement was made of the sound pressure when a standard microphone was set 1 meter ahead of a loudspeaker with an input of 1 watt, the results being set forth in FIG. 3. The curve 1 indicated in a dot-dash line represents the case where the inner walls of the cabinet C were fitted with glass wool 2 to 3 cm thick as shown in FIG. 1A. The wool weighed about 300 g in total. The curve 1 presents sharp peak dips at frequency points around 240 Hz, 650 Hz and 1150 Hz. When the wave lengths of the respective frequencies are calculated from the relationship:

$$v \simeq 340 = f \times \lambda$$

where $v$ = sound velocity in meters per second $f$ = frequency in hertz $\lambda$ = wavelength in meters then, the wave length $\lambda$ at 240 Hz is about 1400mm, the wave length $\lambda$ at 650 Hz about 500mm and the wave length $\lambda$ at 1150 Hz about 300mm. These wave lengths respectively correspond to about 2 times one inner dimension 710mm of the cabinet C, about 2 times another inner dimension 250mm and almost to another inner dimension 290mm. Therefore, the above-mentioned peak dips are supposed to have resulted from a standing wave resonation appearing across the respective facing inner walls of the cabinet C. The curve 2 (indicated in a 2 dots-dash line) denotes the case where the inner walls of the cabinet were fitted with glass wool in substantially the same manner as in FIG. 1B. The glass wool weighed about 700g in total. The curve 2 clearly shows that the peak dips appeared due to a standing wave resonance still arising at the respective frequency points, though the dips were somewhat less noticeable than in the curve 1. The curve 3 indicated in a solid line represents the embodiment of this invention illustrated in FIG. 2, namely, the case where the upper inner half region of the cabinet C was filled with glass wool and the lower inner half region thereof behind the speaker unit SP was filled with 23 soft rubber balls each weighing 15g. In this case, all the rubber balls collectively weighed 345g, and the glass wool plus the rubber balls weighed about 700g in total. The curve 3 proves that a peak dip vanished at the frequency point 240 Hz, though such dip slightly remained at the frequency points 650 Hz and 1150 Hz, namely, that the occurrence of a standing wave between the upper and lower inner walls (along an inner dimension 710 mm) observed in the prior art cabinet C was substantially suppressed.

Measurement was also made of the relationship between the kinds of filler material, the low resonance frequency $f_0'$ of the speaker unit SP fitted to the cabinet C and the $Q_0$ realized in this case. There will now be described the results of the measurement. First about 700g of only glass wool was filled in the cabinet C. That is, when measurement was made under the same conditions as when the curve 2 was obtained, the low resonance frequency $f_0'$ indicated 76 Hz and the $Q_0$ stood at 0.72. When the cabinet C was filled with only rubber balls collectively weighing 700g, there resulted $f_0' = 107$ Hz and $Q_0 = 0.33$. Next, the upper inner half region of the cabinet C was filled with glass wool and the lower inner half region was filled with rubber balls, with both glass wool and rubber balls chosen to weigh 700g in total. That is, when measurement was made under the same conditions as when the curve 3 of FIG. 3 was obtained, there resulted $f_0' = 69$ Hz and $Q_0 = 0.665$. Where a speaker unit SP is fitted to a closed cabinet C, it is generally preferred to set the $Q_0$ of the speaker unit SP under its fitting condition at about 0.7 from the standpoint of a listener's hearing sense. Therefore, the filling of glass wool alone in the cabinet C raises problems in that a standing wave is generated as previously described, though the low resonance frequency $f_0'$ presents little rise and the $Q_0$ has a substantially optimum value. The filling of rubber balls alone in the cabinet C brought about the same condition as when the apparent inner volume of the cabinet was decreased and further caused $f_0'$ and $Q_0$ to have unsatisfactory values. In contrast, the filling of glass wool in the uper inner half region of the cabinet C and rubber balls in the lower inner half region thereof in accordance with this invention more effectively prevented $f_0'$ from rising than the case only glass wool was filled, and enabled $Q_0$ to have a substantially optimum value, but also suppressed the appearance of a standing wave, thus offering prominent advantages. Where, by way of reference, glass wool was filled in the lower inner half region of the cabinet C behind the speaker unit SP and rubber balls were filled in the upper inner half region of the cabinet C in a reverse manner from the condition illustrated in FIG. 2, then there resulted $f_0' = 75$ Hz and $Q_0 = 0.55$, proving that the relative positions of the two kinds of filler material could also suitably control the property of the speaker unit SP.

Figure 4:
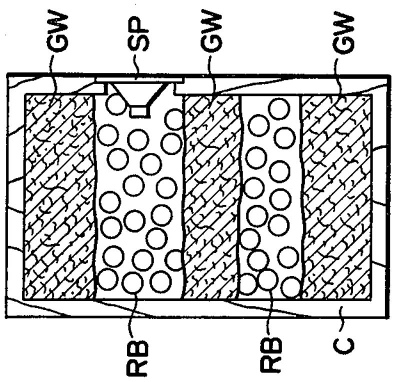
FIG. 4 is a longitudinal sectional view showing the arrangement of a loudspeaker device according to another embodiment of the invention.

The foregoing embodiment refers to the case where cotton-like filler material such as glass wool was filled in the upper inner half region of the cabinet C and another filler material RB consisting of, for example, a large number of rubber balls in the lower inner half region behind the speaker unit SP. For the object of this invention, however, it is possible to fill the whole inner space of the cabinet C, as shown in FIG. 4, with alternately superposed regions of glass wool and rubber balls, or, as schematically illustrated in FIGS. 5A and 5B, with an alternate arrangement of vertical rubber ball RB and glass wool GW regions or as presented in FIGS. 6A and 6B with a staggered arrangement (as viewed in cross section) of rubber ball regions RB and glass wool regions GW in which RB and GW are alternately disposed in the vertical, lengthwise and crosswise directions of the cabinet C.

The foregoing embodiment refers to the case where the flexible gas or air bearing filler material RB was formed of, for example, rubber balls. However, the filler material RB may consist of another cellular type made of, for example, spongy rubber, or polyurethane foam, provided such constituent material can display an air load mass-adding action. FIGS. 7A and 7B represent the case where a large number of, for example, foamed polyurethane blocks FS are filled in the rear section, and one side section of the inner space of the cabinet C and in that section thereof which faces the backside of the speaker unit SP, and, for example, glass wool is filled in the remaining section of the inner space of the cabinet C. Measurement was made of the properties of a loudspeaker device, the speaker cabinet of which was constructed in the same manner as in the preceding cases (a cabinet C and speaker unit SP of the same type as previously described were used). All the polyurethane foam FS blocks used collectively weighed about 350g and glass wool weighed about 350g, the total weight of both filler materials being about 700g. The sound pressure characteristic in this case was such as represented by the curve 4 indicated in a broken line in FIG. 3. Namely, the characteristic presented a substantially smooth outline free from any peak dip, thus more effectively suppressing the generation of a standing wave than in the case of the curve 3. Where polyurethane foam or the like is used as a filler material, it is possible to fill the material not only in the form of parallelepiped blocks each having dimensions of 5cm × 7cm × 10cm so as to provide a gap through which sound waves pass, but also in the form of spheres as shown in FIG. 8 so as to provide gaps for the passage of sound waves. The form defined by polyurethane foam may further be an octahedron or any other polyhedron. Where relatively large polyurethane foam blocks FS are applied as a filler material, it is advised to bore, as illustrated in FIGS. 9 and 10, with a large number of slits S or holes H for the passage of air streams, respectively. The preceding embodiments refer to a closed speaker cabinet. However, this invention is further applicable to another type of speaker cabinet, for example, that which is open at the rear side.

What is claimed is:

1. A loudspeaker device having a speaker unit and a speaker cabinet fitted with the speaker unit, the speaker cabinet comprising at least one first inner region filled with a first filler material formed of a flexible, gas-bearing material comprising a large number of rubber balls and at least one second inner region disposed adjacent to said first inner region and filled with a second filler material made of fibrous cotton-like material.

2. A loudspeaker device according to claim 1 wherein said speaker cabinet has spaced front and rear faces defining a depth, each face having a length and a width, with said speaker unit mounted in said front face, and with said first and second inner regions arranged in the direction of said length.

3. A loudspeaker device according to claim 1 wherein said speaker cabinet has spaced front and rear faces defining a depth, each face having a length and a width, with said speaker unit mounted in said front face, and with said first and second inner regions arranged in the direction of said depth.

4. A loudspeaker device according to claim 1 wherein said speaker cabinet has spaced front and rear faces defining a depth, each face having a length and a width, with said speaker unit mounted in said front face, and with said first and second inner regions alternately arranged in the directions of said length, said width and said depth.

5. A loudspeaker device according to claim 1, wherein the second filler material is glass wool.

6. A loudspeaker device according to claim 1, wherein the second filler material is rock wool.

7. A loudspeaker device according to claim 1, wherein the second filler material is coarse felt.

8. A loudspeaker device having a speaker cabinet with spaced front and rear faces defining a depth, each face having a length and a width, and a speaker unit mounted in said front face, said speaker cabinet having at least one first inner region filled with a first filler material formed of a flexible, gas-bearing material and at least one second inner region adjacent to said first inner region and filled with a second filler material made of a fibrous cotton-like material.

9. A loudspeaker device according to claim 8 wherein said first and second inner regions are arranged in the direction of said length.

10. A loudspeaker device according to claim 8 wherein said first and second inner regions are arranged in the direction of said depth.

11. A loudspeaker device as defined in claim 8 wherein said first and second inner regions are alternately arranged in the directions of said length, said width and said depth.

* * * * *